METHOD OF FABRICATING SEMICONDUCTOR DEVICES

Original Filed July 20, 1960 2 Sheets-Sheet 1

INVENTOR.
DEREK THORNE
BY
W.S. Hill
AGENT

METHOD OF FABRICATING SEMICONDUCTOR DEVICES

Original Filed July 20, 1960 2 Sheets-Sheet 2

INVENTOR.
DEREK THORNE
BY
W.S. Hill
AGENT

United States Patent Office 3,224,069

Patented Dec. 21, 1965

3,224,069

METHOD OF FABRICATING SEMICONDUCTOR DEVICES

Derek Thorne, Somerville, N.J., assignor to Radio Corporation of America, a corporation of Delaware Original application July 20, 1960, Ser. No. 44,205. Divided and this application Apr. 1, 1965, Ser. No. 449,674

5 Claims. (Cl. 29—25.3)

This application is a division of application Serial No. 44,205, filed July 20, 1960.

This invention relates to improved methods of fabricating semiconductor devices.

An object of the invention is the provision of an improved method of making improved semiconductor devices.

Another object of the invention is the provision of an improved method of reducing the base resistance of a semiconductor device.

These and other objects of the invention are accomplished by providing a semiconductor device and a novel method of manufacture thereof, said device comprising a semiconductive wafer having two opposing major faces, two apertured base tabs bonded to the opposing wafer faces so that the apertures in the tabs are coaxially aligned, and two electrode pellets coaxially attached to the opposing wafer faces so that one electrode is entirely within the aperture of one base tab, while the other electrode is entirely within the aperture of the other base tab.

Figure 1A:
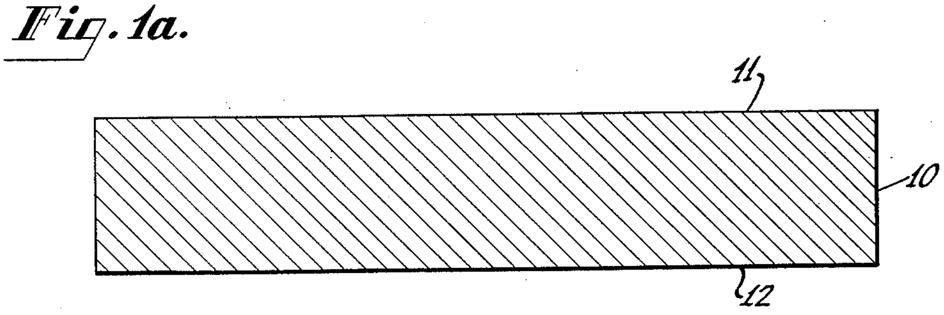
Figure 1B:
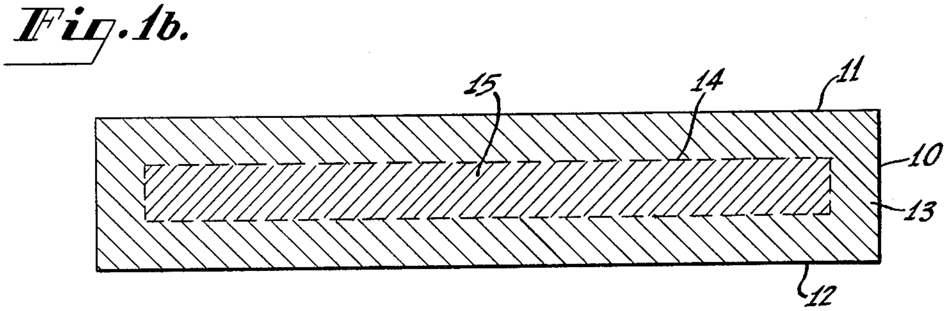
Figure 1C:
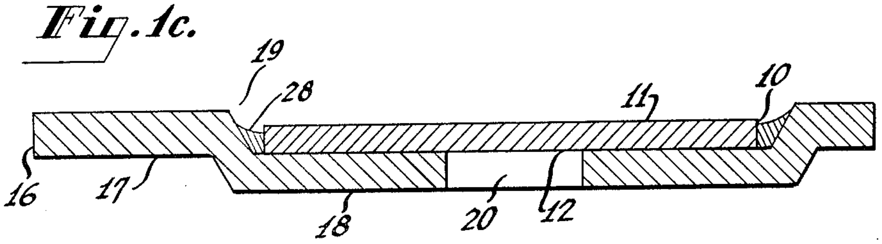
Figure 1D:
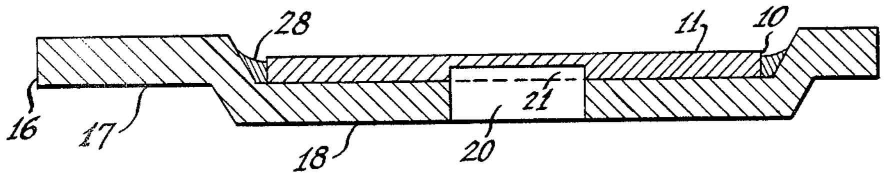
Figure 1E:
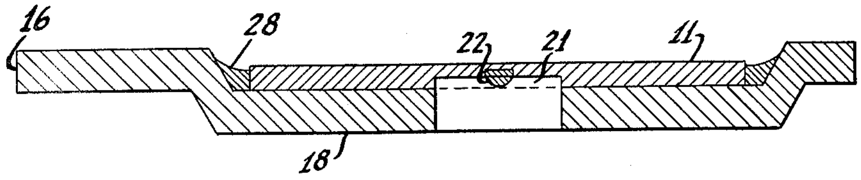
Figure 1F:
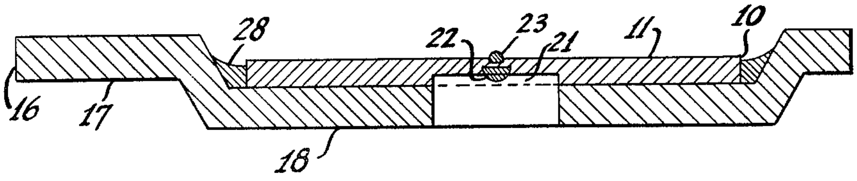
Figure 1G:
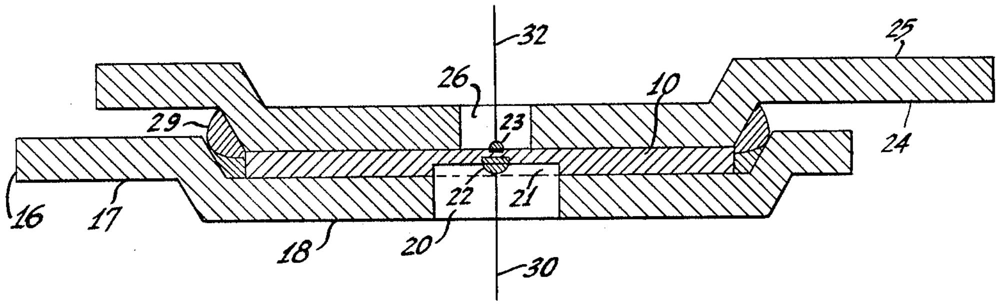
Figure 2:
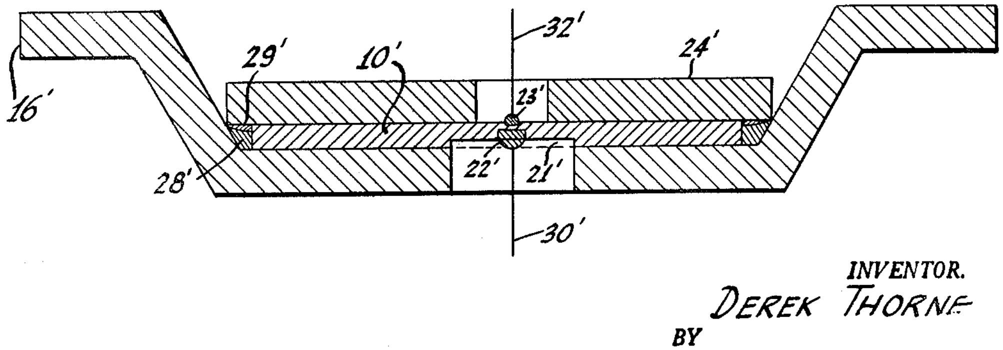

The invention and its advantages will be described in greater detail with reference to the accompanying drawing, in which:

FIGURES 1*a*–1*g* are cross-sectional, elevational views of successive steps in the fabrication of a semiconductor device according to one embodiment of the invention; and, FIGURE 2 is a cross-sectional, elevational view of a semiconductor device according to another embodiment of the invention.

Similar reference characters have been applied to similar elements throughout the drawing.

The first embodiment will be described in connection with the fabrication of a triode transistor, but it will be understood that this is by way of illustration only, and not limitation, since the invention is equally applicable to other types of semiconductor devices such as tetrode transistors, hook transistors, and the like.

Referring to FIGURE 1*a*, a semiconductor wafer 10 of either conductivity type is prepared with two opposing major faces 11 and 12. Any crystalline semiconductive material such as germanium, silicon, germanium-silicon alloys, indium phosphide, gallium arsenide, and the like may be utilized for this purpose. In this example, the wafer 10 consists of monocrystalline germanium. The exact wafer size and conductivity type are not critical. In this example, wafer 10 is about 50 mils square, 2 mils thick, and lightly N-type with a resistivity of about 18 to 35 ohm-centimeters.

A conductivity type-determining impurity material is diffused into the wafer 10 to form a surface zone 13 of the same conductivity type as the original wafer but increased conductivity. In this example, since the wafer 10 is of a N-conductivity type, the material diffused into the wafer is a donor. Diffusion may conveniently be accomplished by the method described in U.S. Patent 2,870,050, issued January 20, 1959, to C. W. Mueller et al., and assigned to the same assignee as that of the instant application. In this example, the wafer 10 is heated for 15 minutes at 830° C. while immersed in a powder of germanium-arsenic alloy having a resistivity of about .001 ohm-centimeter. Under these conditions, an arsenic-diffused surface zone 13 is formed in the wafer 10, as shown in FIGURE 1*b*. After this diffusion step, the concentration of donors on the surface of wafer 10 is about $5 \times 10^{17}$ per cm.$^3$. The N-type surface zone 13 thus formed is fairly shallow since, under these conditions, the arsenic diffuses to a depth 14 of about 0.2 mil. Beneath the surface zone 13 is a central zone 15 consisting of the original high resistivity wafer material. The thickness of wafer 10 in FIGURES 1*a* and 1*b* should .04 time the wafer length for a scale drawing, but the thickness has been increased to show diffused zone 13 more clearly.

Referring now to FIGURE 1*c*, in which the scale of the drawing is changed, an apertured base tab 16 is bonded to one major face 12 of wafer 10. Advantageously, the base tab 16 may be a metal member such as described in application of Louis Pensak, Serial No. 524,191, filed July 25, 1955, issued November 29, 1960 as U.S. Patent 2,962,639 and assigned to the assignee of the instant application. In this example, tab 16 is made of nickel plated with 60 tin–40 lead solder, has the general shape of a keyhole, and comprises a short shank portion 17, an eye portion 18, a recess 19 embossed within the eye portion 18, and an aperture 20 through the thickness of the tab within the recess 19. Preferably the floor of recess 19 is only slightly larger than wafer 10, and the depth of recess 19 is about twice the thickness of wafer 10. The semiconductor wafer 10 is positioned with one major wafer face (12 in this example) on the floor of recess 19 of base tab 16, and the assemblage is heated for 3 minutes at 460° C. in a hydrogen atmosphere. A small amount of the solder plating on base tab 16 is thereby melted, which on cooling solidifies as a solder filet 28 so as to bond wafer 10 to tab 16. Since the solder is electrically neutral with respect to the particular semiconductor utilized (germanium in this example), the bond between wafer 10 and tab 16 is ohmic in character. The tab 16 serves as a carrier for transporting the fragile wafer 10 during the subsequent operations, and also serves as a mask during the formation of a well in the wafer, as described below.

A well 21 is made through the surface zone 13 in that portion of the wafer which is exposed by aperture 20 of tab 16. This is conveniently accomplished by masking the major wafer face (11 in this example) which is opposite the wafer face (12 in this example) bonded to tab 16. A suitable mask is an acid resist such as apiezon wax. For mass production, a plurality of bonded wafer-tab assemblages with base tab upwards are placed on a glass slide covered with apiezon wax. The entire array is then immersed in a suitable etchant. In this example, the etchant is composed of 80 parts 70% $HNO_3$, 50 parts 52% HF, 50 parts glacial acetic acid, and 1 part bromine. This etchant will attack the exposed germanium, but will not attack the metal base tabs. The wafer-tab assemblages are treated in this etchant for about 70 seconds, which is sufficient to form in each assemblage a well 21 about 0.8 to 1 mil deep in the portion of wafer 10 exposed by aperture 20 of tab 16. The units are then removed from the slide and washed in trichlorethylene. As shown in FIGURE 1*d*, the perimeter of well 21 thus formed corresponds to the perimeter of aperture 20. As the well 21 is about 1 mil deep and the thickness of the diffused surface zone 13 is only about 0.2 mil, the bottom of well 21 exposes the central high resistivity portion 15 (FIGURE 1*b*) of wafer 10.

Referring now to FIGURE 1*e*, an electrode pellet 22 is attached to the high resistivity wafer material at the bottom of well 21 by heating the assemblage of pellet 22, wafer 10, and tab 16 to a lower temperature (415° C. in this example) than the temperature subsequently utilized for alloying. This method of attaching an electrode pellet to a semiconductor wafer at a low temperature and subsequently alloying the pellet to the wafer at a higher temperature is described in U.S. Patent 2,825,667, issued to C. W. Mueller on March 4, 1958, and assigned to the assignee of the instant application. In this example, the electrode pellet 22 is an indium spherule 8 mils in diameter. After the pellet 22 is attached but before it is alloyed to the wafer, it has been found advantageous to brush a 2 percent water suspension of magnesium hydroxide over the wafer, as described in U.S. Patent 2,836,-522, issued to C. W. Mueller on May 27, 1958, and assigned to the assignee of this application. Alloying is accomplished by heating the assemblage of tab, wafer, and electrode pellet for 6 minutes at 560° C. in a hydrogen atmosphere. Advantageously, the electrode pellet 22 is constrained during the alloying step to produce a planar junction, as described in U.S. Patent 2,937,960, issued to J. I. Pankove on May 24, 1960, and assigned to the same assignee as the instant application.

Next, a second electrode pellet 23 is similarly alloyed to the wafer face 11 opposite well 21. As shown in FIGURE 1*f*, electrode pellet 23 is coaxially aligned with electrode 22. In this example, pellet 23 is an indium spherule having a diameter of about 4.5 mils. The smaller electrode 23 is utilized as the emitter of the completed unit, and the larger electrode 22 becomes the collector of the device. The emitter electrode 23 is preferably alloyed at a temperature of about 470° C., which is lower than that employed for the collector electrode 22. Advantageously, the rate of penetration of indium pellet 23 into wafer 10 during the alloying step may be controlled by using indium containing about 0.6 weight percent of zinc for the pellet material, as described in an application of L. D. Armstrong, Serial No. 486,909, filed February 8, 1955, issued October 25, 1960 as U.S. Patent 2,957,788 and assigned to the same assignee as the instant application. Wetting of wafer 10 by electrode 23 is facilitated by using a flux of trimethylamine hydrochloride, as described in U.S. Patent 2,761,800, issued to N. H. Ditrick on September 4, 1956, and assigned to the assignee of this application. After the second rectifying electrode 23 has been alloyed to wafer 10, the magnesium hydroxide is removed by immersing the assemblage in 50% acetic acid for 5 minutes.

Referring now to FIGURE 1*g*, a second apertured base tab 24 is bonded to the major wafer face opposite well 21. Tab 24 is made of nickel plated with tin-lead solder and is generally similar to tab 16. In this example, the shank portion 25 of tab 24 is longer than the corresponding shank portion 17 of tab 16, and the aperture 26 of tab 24 is smaller than the corresponding aperture 20 of tab 16. Tab 24 is positioned on wafer 10 so that aperture 26 is concentric with aperture 20 of tab 16, and electrode pellet 23 is entirely within aperture 26. The shank portions 17 and 25 of tabs 16 anud 24 respectively need not be aligned. The assemblage is then heated for 3 minutes at 440° C. in a hydrogen atmosphere. A portion of the plated solder on tab 24 melts, and on cooling solidifies as a solder filet 29 which unites with the solder filet 28 of tab 16, thus simultaneously bonding tab 24 to wafer 10 and forming an electrical connection between tabs 16 and 24. To complete the device, lead wires 30 and 32 are attached to electrodes 22 and 23 respectively. The unit is then mounted on a base stem, encapsulated and cased by methods known to the art.

A high base resistance has a deleterious effect on the performance of transistors at elevated frequencies. An increase in this parameter ($r_{bb'}$) lowers the high frequency gain of the device by attenuating the input signal, and lowers the frequency cutoff of the device by the feedback effect from the output to the input circuit. Transistors fabricated in accordance with the invention as described above exhibit a base resistance of between 20 and 35 ohms, whereas corresponding devices of the prior art having only a single base tab exhibit a base resistance of about 100 ohms. This reduction in base resistance is manifested as an improvement of about 3 db (decibels) in the power gain at 100 mc. for transistors according to the invention when measured in the common base configuration.

In the prior art method of fabricating transistors using a single base tab, the tab-wafer assemblage is exposed to the elevated temperatures required for alloying the electrode pellets to the semiconductor wafer. During such exposures to elevated temperatures, the solder coating on the tab tends to dissolve completely through the low-resistivity surface zone of the wafer, as the zone is relatively thin, being only about .2 mil thick in the above example. When the solder coating on the tab dissolves through the low resistance surface zone of the wafer, the electrical connection between the base tab and the unit is formed through the high resistivity central portion of the wafer, and hence the effective internal resistance between the emitter electrode and the base electrode is increased. In order to prevent such dissolution of the diffused region in a device with a single base tab according to the prior art, the solder must not penetrate the wafer to a depth greater than about one-tenth the thickness of the diffused zone, which penetration would be about .02 mil in the above example. Furthermore, point wetting of the wafer by the solder and pull-back of the solder from the wafer must be prevented. These objectives are extremely difficult to attain, and in practice result in a high scrap rate. Attempts have been made to avoid this difficulty by first alloying the electrode pellets to the wafer at an elevated temperature, and subsequently bonding the base tab to the wafer at a lower temperature. However, this method requires the handling of very thin, unsupported semiconductor wafers during the alloying process. Since such handling of fragile and brittle semiconductor wafers results in a high scrap rate prior to the bonding of the base tab, these attempts have merely exchanged one difficulty for another.

In the method of this invention, the dissolution of wafer surface zone 13 by the first base tab 16 can be tolerated, because the second tab 24 is bonded to wafer 10 at a relatively low temperature (about 440° C. in the above example), and is not subsequently exposed to higher temperatures. As a result, the penetration of surface zone 13 by the second tab 24 is small, and the resistance between tab 24 and wafer 10 is low. The effective base resistance is further reduced because the wafer-tab resistance of the first tab 16 is added in parallel to the wafer-tab resistance of the second tab 24.

It will be understood that although the above illustration recited a PNP germanium device utilizing indium as the acceptor and arsenic as the donor, other acceptors such as boron and aluminum, and other donors such as phosphorus and antimony may be utilized instead. Wafers of silicon and silicon-germanium alloys may be substituted for the germanium wafer. The conductivity types of the wafer and the electrode pellets may also be reversed to fabricate NPN devices. The semiconductor wafer may consist of other semiconductive materials such as indium phosphide, gallium arsenide, and the like, with appropriate acceptors and donors in each case.

Various modifications may be made without departing from the spirit and scope of the invention. For example, in the embodiment shown in FIGURE 2, the semiconductor wafer 10′ is bonded to an apertured base tab 16′ by a solder filet 28′. Wafer 10′ is seated in a tab recess 19′ which is deeper than the corresponding recess 19 of the previous embodiment shown in FIGURE 1. A well is formed in wafer 10′, and rectifying electrodes 22′ and 23′ are alloyed to opposing major wafer faces as described in the first embodiment. A second apertured base tab 24′ is then bonded to wafer 10′ around electrode 23′ by means of solder filet 29′, which unites with solder filet 28′ to form an electrical connection between tab 16′ and tab 24′. In this embodiment, the second base tab 24′ is a flat apertured metal disc.

The device is completed by attaching lead wires 30' and 32' to electrodes 22' and 23' respectively. Other modifications may be made in which both base tabs are substantially flat. Alternatively, both base tabs may have dished or concave portions which face each other and enclose the semiconductor wafer.

There have thus been described improved methods of making semiconductor devices with reduced base resistance.

What is claimed is:

1. A method of fabricating a semiconductor device comprising the steps of preparing a given conductivity type semiconductive wafer with two opposing major faces, said wafer having a surface zone of said given conductivity type but greater conductivity than the interior thereof; bonding a first apertured base tab to one of said major faces; removing said surface zone in the region within the aperture of said first base tab; attaching a first electrode to said wafer within said aperture; attaching a second electrode to the other said opposing major wafer face; bonding a second apertured base tab to the said other opposing major wafer faces so that the aperture of said second base tab surrounds said second electrode and is coaxially aligned with the aperture of said first base tab; and bonding said base tabs together.

2. A method of fabricating a semiconductor device comprising the steps of preparing a given conductivity type semiconductive wafer with two opposing major faces, said wafer having a surface zone of said conductivity type but greater conductivity than the interior thereof; ohmically bonding a first apertured base tab to one said major face; removing said surface zone in the region within the aperture of said first base tab; alloying a first rectifying electrode pellet to said wafer within said aperture; coaxially alloying a second rectifying electrode pellet to the other of said major faces; ohmically bonding a second apertured base tab to said other major wafer face so that the aperture of said second base tab surrounds said second electrode pellet and is coaxially aligned with the aperture of said first base tab; and bonding said base tabs together.

3. A method of fabricating a semiconductor device comprising the steps of preparing a given conductivity type semiconductive wafer with two opposing major faces; bonding an apertured base tab to one said major face; using said tab as a mask while forming a well in the portion of said wafer within said tab aperture; attaching a first electrode to the bottom of said well; and attaching a second electrode to the other of said opposing major wafer faces.

4. A method of fabricating a semiconductor device comprising the steps of preparing a given conductivity type semiconductive wafer with two opposing major faces, said wafer having a surface zone of said given conductivity types but greater conductivity than the interior thereof; bonding an apertured base tab to one said major face; using said tab as a mask while removing the portion of said surface zone within said tab aperture; attaching a first electrode to said wafer within said aperture; and attaching a second electrode to the other of said faces.

5. A method of fabricating a semiconductor device comprising the steps of preparing a given conductivity type semiconductor wafer with two opposing major faces, said wafer having a surface zone of said given conductivity type but greater conductivity than the interior thereof; bonding a first apertured base tab to one said major face; using said tab as a mask while removing the portion of said surface zone within said aperture of said first tab; attaching a first electrode to said wafer within said aperture; attaching a second electrode to the other of said faces; and bonding a second apertured base tab to said other major wafer face so that the aperture of said second tab surrounds said second electrode.

References Cited by the Examiner

UNITED STATES PATENTS

| | | | |
|---|---|---|---|
| 2,857,527 | 10/1958 | Pankove | 317—235 |
| 2,927,222 | 3/1960 | Turner | 307—88.5 |
| 3,073,006 | 1/1963 | New | 29—25.3 X |
| 3,094,764 | 6/1963 | Pohl | 29—25.3 |

RICHARD H. EANES, Jr., *Primary Examiner.*